United States Patent [19]

Temple

[11] Patent Number: 4,821,095
[45] Date of Patent: Apr. 11, 1989

[54] INSULATED GATE SEMICONDUCTOR DEVICE WITH EXTRA SHORT GRID AND METHOD OF FABRICATION

[75] Inventor: Victor A. K. Temple, Clifton Park, N.Y.

[73] Assignee: General Electric Company, Schenectady, N.Y.

[21] Appl. No.: 25,036

[22] Filed: Mar. 12, 1987

[51] Int. Cl.⁴ ............................................. H01L 29/78
[52] U.S. Cl. ..................................... 357/23.4; 357/20; 357/22; 357/38; 357/43; 357/86
[58] Field of Search ................... 357/20, 23.4, 38, 43, 357/86, 22 E, 39

[56] References Cited

U.S. PATENT DOCUMENTS

| | | | |
|---|---|---|---|
| 3,465,216 | 9/1969 | Teszner | 357/22 E |
| 3,831,187 | 8/1974 | Neilson | 357/38 |
| 4,275,408 | 6/1981 | Yokimoto | 357/38 |
| 4,466,175 | 8/1984 | Coe | 357/23.4 |
| 4,466,176 | 8/1984 | Temple | 357/23.4 |
| 4,503,598 | 3/1985 | Vora et al. | 357/23.4 |
| 4,587,713 | 5/1986 | Goodman et al. | 29/576 |
| 4,680,604 | 7/1987 | Nakagawa et al. | 357/38 |
| 4,717,940 | 1/1988 | Shinohe et al. | 357/43 |

Primary Examiner—Joseph E. Clawson
Attorney, Agent, or Firm—Robert Ochis; James C. Davis, Jr.; Marvin Snyder

[57] ABSTRACT

An improved insulated gate semiconductor device is provided with an extra short grid region of one type conductivity disposed proximate the PN junction between the first and second regions of the device. The extra short grid region provides an alternate path for one type conductivity carriers to inhibit forward biasing of the PN junction between the first and second electrodes. In addition, the grid allows opposite type conductivity carriers to flow therethrough. A portion of the grid is spaced and separated from the first region. Accordingly, a device fabricated in accordance with the present invention is less susceptible to latching and exhibits a higher voltage latching threshold.

16 Claims, 10 Drawing Sheets

CONVENTIONAL DEVICE

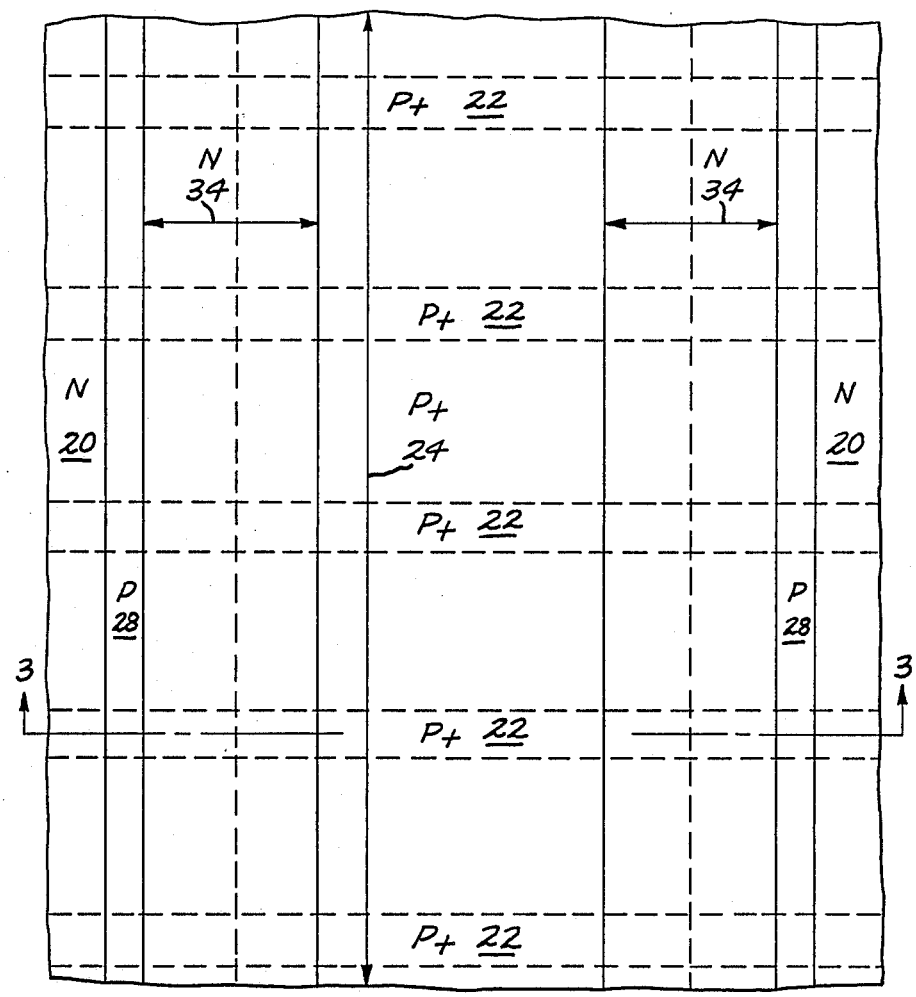

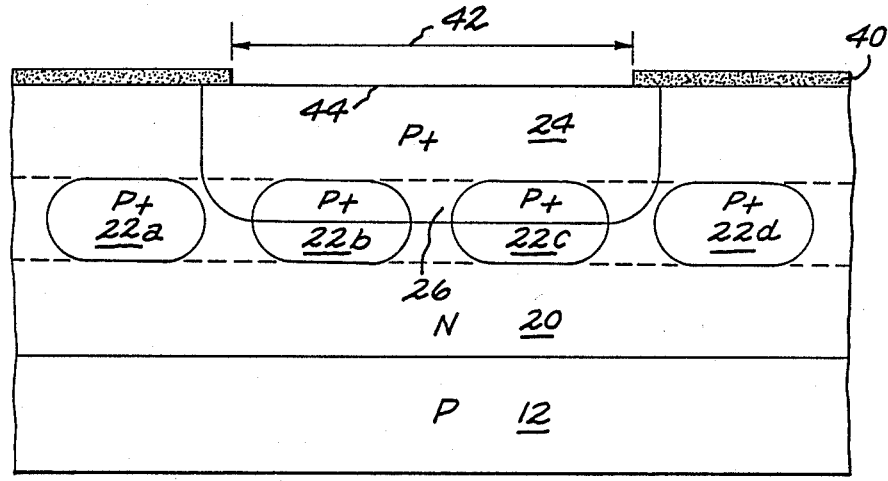
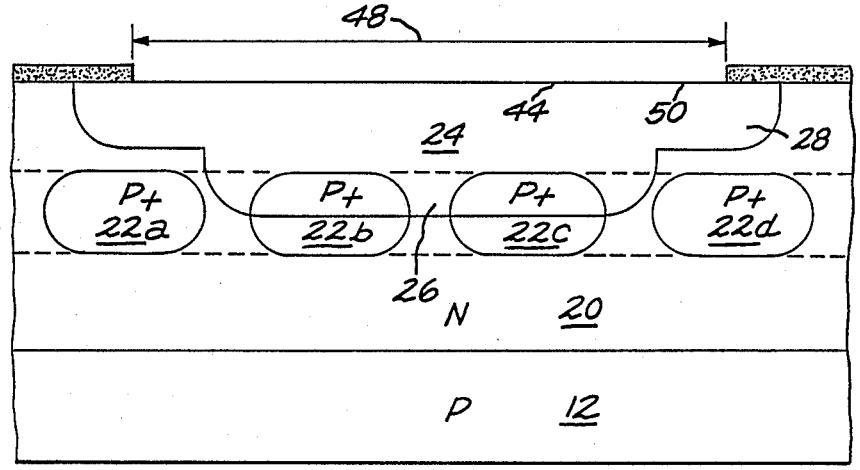

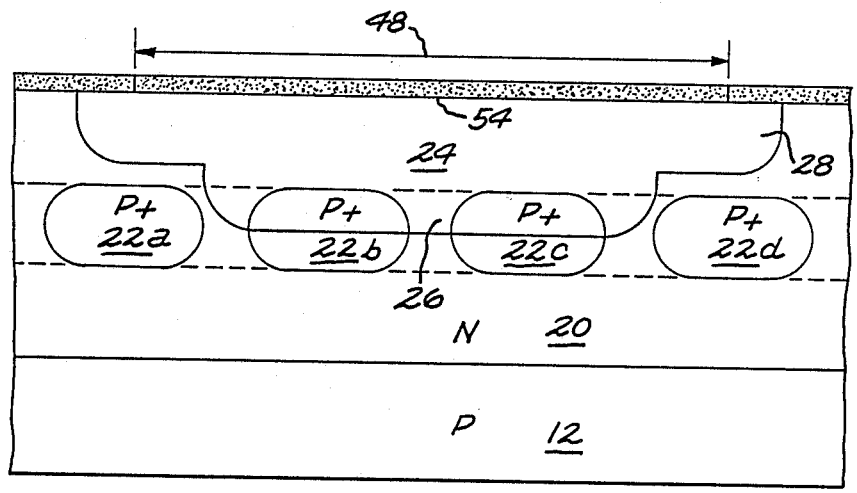
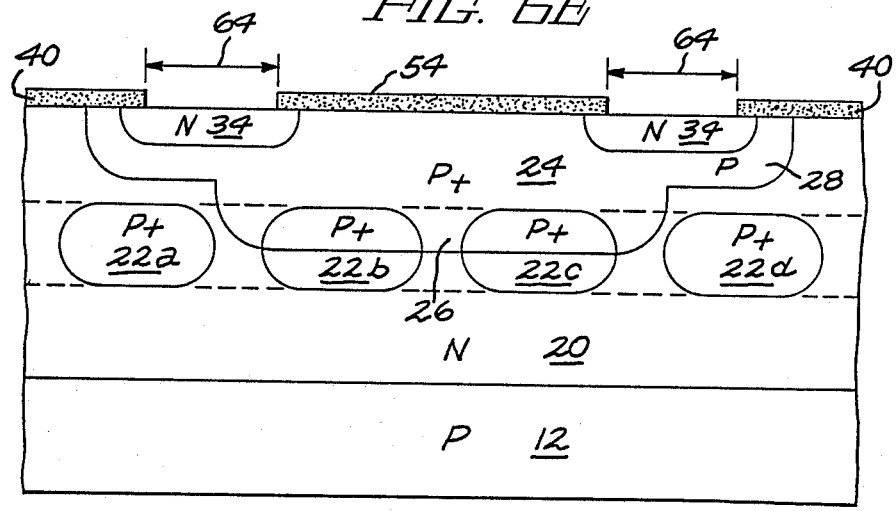

INSULATED GATE SEMICONDUCTOR DEVICE WITH EXTRA SHORT GRID AND METHOD OF FABRICATION

BACKGROUND OF THE INVENTION

The present invention relates to insulated gate semiconductor devices and more particularly to those insulated gate devices which are susceptible to achieving a non-preferred latched state of operation. Insulated gate devices which are susceptible to latching include insulated gate transistors, insulated gate thyristors, and other MOS controlled devices which have one or more inherent bipolar transistors included therein. Under latched operating circumstances, the base emitter junction of the inherent transistor can become forward biased causing the device to continue to conduct current even though the gate drive has been turned off. Thus, insulated gate control of the device can be lost and it is then generally necessary to remove the forward bias potential and/or commutate the device to stop current flow and to turn the device off.

Referring now to FIG. 1, a conventional insulated gate transistor comprising four layers of alternate conductivity material is shown. A cathode electrode is disposed in ohmic contact with the base and souce regions. An insulated gate is disposed over the base and conductively couples opposite type conductivity carriers from the cathode through a base region gate induced channel into the drift region of the device. At the same time, one type conductivity carriers flow through the base and drift regions between the anode and the cathode electrode. One type conductivity carriers, however, flowing along the PN junction between the base and emitter regions can establish a voltage drop V along this junction. In the event the voltage drop along this junction exceeds approximately 0.7 volts in a silicon device, the junction can become forward biased causing the upper NPN transistor to conduct. Once activated, the upper transistor establishes a regenerative conduction relationship with the lower PNP transistor so that the device as a whole functions as a silicon controlled rectifier or thyristor which is regeneratively latched into a conductive state. Insulative gate control of this device is thus lost.

OBJECTS OF THE INVENTION

A principal object of the present invention is therefore to provide improved insulated gate semiconductor devices in which the inherent transistors are less susceptible to being inadvertently activated or turned on to render uncontrolled or latched conduction less possible.

It is further object of the present invention to provide an improved insulated gate semiconductor device in which a high conductivity alternate current path is established proximate the PN junction to thus reduce the current flow within the region adjacent the PN junction and hence voltage drop adjacent the PN junction.

Another object of the present invention is to provide a high voltage insulated gate semiconductor device which efficiently employs a one type conductivity grid structure proximate a one type conductivity base region to facilitate conduction of one type carriers outside the base region of the device without imposing an unnecessary voltage drop on the base emitter PN junction.

A still further object of the present invention is to provide an insulated gate semiconductor device employing a grid structure comprising a plurality of separate regions disposed within the drift region of the device to provide for direct contact between the drift and base regions of the device and to provide an alternate current path for minority carrier flow within the device.

An additional object of the present invention is to control the doping concentration and depth of the various regions of the device to minimize the on-resistance within the minority carrier current path to minimize the voltage drop in that path.

SUMMARY OF THE INVENTION

These and other objects and features of the present invention are achieved in an insulated gate semiconductor device such as an insulated gate transistor. A preferred embodiment of the present invention can be fabricated from silicon material. The body of the device can comprise a partially processed wafer which in the illustrated example of an insulated gate transistor includes a first layer of one type conductivity silicon material. A second layer of opposite type conductivity silicon material is disposed atop the first layer. Either the first or the second layer can be the substrate with the other layer device being established thereon by epitaxial growth. Alternatively, the first or second layer can be used as the substrate with the other layer being established by doping the substrate with the appropriate type dopant impurity by, for instance, diffusion or implantation doping techniques. A first region of the one type conductivity is disposed within the second layer and forms a PN junction therewith. A second region of opposite type conductivity is disposed wholly within the first region and forms a first PN junction therewith. An insulated gate structure is disposed over a portion of the first region and in response to an appropriate applied bias potential, a channel is established through the first region for facilitating the flow of opposite type conductivity carriers from the second region to the second layer. A first surface of the device comprises a portion of the second layer and a portion of the first and second regions. A cathode electrode is disposed on the first surface in ohmic contact with the first and second regions. An anode electrode is disposed in ohmic contact with the first layer.

A heavily doped grid of the one type conductivity semiconductor material is disposed within the second layer beneath the first surface proximate the first PN junction between the first and second regions. The grid can comprise a plurality of discrete one type conductivity regions at least one of which overlaps and is directly connected to said first layer and another of which overlaps and is directly connected to the first region. It is preferred that the discrete grid regions be electrically interconnected to form a substantially equipotential grid network. It is also preferred that each grid region be heavily doped and equidistantly spaced from and beneath the surface of the device such that the grid comprises an equipotential plane which is substantially parallel to the upper surface of the device. The grid can be separately connected to an external electrode, or alternatively, can be coupled via the first region to the cathode electrode.

The grid provides an alternate current path for the flow of one type conductivity carriers between the anode and cathode electrodes. The grid reduces the portion of one type conductivity carriers flowing into the first region adjacent the first PN junction to thereby prevent the flow of one type conductivity carriers proximate the junction from developing a voltage drop sufficient to forward bias the junction. It is preferred that a grid construction comprising a plurality of interconnected one type conductivity grid regions be used to facilitate the flow of opposite type conductivity carriers in the interstices of the grid between the grid regions to thus facilitate the flow of opposite type conductivity carriers to the cathode electrode of the device. It is also preferred that the grid provide an interstitial opening beneath the channel portion of the device.

At least one region of the grid can be spaced from the second region of the grid by a portion of the second layer. The grid is preferably disposed entirely beneath the surface of the device and more specifically, entirely beneath the channel portion. Further, it is preferred that a first grid region be separated from the second device region by the second device layer and extend beneath the first and second regions of the device to provide an effective means for controlling the flow of one type conductivity carriers within the first region of the device.

It is also preferred that the grid comprise a plurality of regions with each region having lateral cross-sectional dimension which is 25% or less of the lateral cell dimension. A grid of this dimension is tolerant of device misalignments inasmuch as such a grid will provide an interstitial carrier path regardless of the placement of the base region relative to the grid. While the grid can be disposed in any orientation in a plane through an annular base region, in semi-cylindrical base regions, it is preferred that the long or primary axis of the grid be disposed transverse and approximately perpendicular to the long or primary axis of the base region. While the transverse orientation provides particularly preferred results, the grid can be oriented such that the primary axis of the grid is approximately parallel to the primary axis of the base region.

In a preferred embodiment, a method of fabricating an improved insulated gate semiconductor device as applied to an insulated gate transistor, comprises the steps of providing a partially processed semiconductor wafer comprising a first layer of one type conductivity semiconductor material and a second layer of opposite type conductivity material atop thereof. A first surface of the partially processed wafer comprises opposite type conductivity material and a second surface of the wafer comprises one type conductivity material. Initially, a series of implantations are made through said first surface with one type impurity material to provide a grid comprising a plurality of discrete one type conductivity semiconductor material regions disposed in a plane submerged beneath and approximately parallel to the first surface of the wafer. Subsequently, a first protective layer is provided on the first surface of the wafer. It is preferred that the first protective layer comprise an insulation layer which can be used in combination with a subsequently applied gate electrode to establish an insulated gate on the first surface of the device. While the first protective layer preferably comprises a silicon dioxide layer, other protective layers such as photoresist and nitride layers can also be used.

A first window is opened through the first protective layer. A first portion of the first surface of the second layer exposed by the first window is doped with one type conductivity impurity material to establish a first region of one type conductivity within the second layer.

Subsequently, a second protective layer is deposited within the first window and a second window is opened within the area of the first window to expose a second surface portion of the first layer. The second window is preferably ring-shaped in horizontal cross section. Opposite type conductivity determining impurities are introduced into the second surface portion of the second layer exposed by the second window to establish a second region of opposite type conductivity wholly within the first region.

Thereafter, a third protective layer is opened within the second window and a gate material is deposited on the surface of the first insulation layer overlying a portion of the first region situated between the second region and the second layer. A portion of the second and third protective layers is removed and an electrode material such as aluminum is deposited to form ohmic electric contact with the first and second regions of the device to provide a surface short between the first and second regions and to inhibit the first PN junction between the first and second regions from becoming forward biased. An electrode material such as aluminum is also deposited in ohmic electric contact with the first layer to form an anode electrode.

In a preferred embodiment, an external electrode is applied to the grid region of the device and provides an additional electrode for the flow of one type conductivity current within the device. The external electrode applied to the grid region is preferably coupled directly to the cathode metal to allow the device to function as a three terminal device.

In further preferred embodiments of the method of the present invention, the first region can be established within the second layer of the partially processed wafer by providing a first window comprising two concentric portions. A first central portion can be used to establish a heavily doped central portion of the first region having a depth substantially greater than the depth of a more lightly doped perimeter portion of the first region. For instance, initially a small central window can be opened to expose a central portion of the second layer doped. The exposed central portion of the second layer is doped with a heavy concentration of the one type conductivity carriers. Subsequently, a larger widow encompassing the central portion of the first layer can be opened and the larger portion of the surface of the first layer can be doped with a moderate concentration of the one type conductivity carriers.

The present invention thus provides for an improved insulated gate semiconductor device which exhibits increased resistance to undesired latched operation. This functional improvement allows a device of a given dimension, which previously could only be operated at lower voltages, to be operated at a higher voltage. Thus, the device of the present invention has increased latching threshold and hence an increased maximum operating voltage.

BRIEF DESCRIPTION OF THE DRAWINGS

The features of the present invention which are believed to be novel are specified with particularity in the appended claims. The invention itself, both as to organization and method of operation together with additional features, objects and advantages of the improved insulated gate semiconductor device with extra short grid can be best understood by reference to the following detailed description when taken in conjunction with the accompanying drawings in which:

FIG. 3A is a top plan view of a preferred embodiment of a semiconductor device in accordance with the present invention taken along lines 3A—3A in FIG. 3;

FIGS. 6A-6H are illustrations of an insulated gate transistor shown in successive steps of fabrication during the performance of a preferred method of fabricating the present invention.

DETAILED DESCRIPTION OF THE PREFERRED EMBODIMENTS

The present invention provides for the establishment of an insulated gate semiconductor device having improved resistance to inadvertent latched operation. The present invention is applicable to a broad range of insulated gate semiconductor devices and can be fabricated from a variety of different semiconductor materials. The ensuing description will disclose several preferred embodiments of the improved insulated gate semiconductor device of the present invention as implemented in a silicon substrate because silicon devices or devices fabricated in silicon substrates make up an overwhelming majority of the currently available semiconductor devices. Consequently, the most commonly encountered applications of the present invention will involve silicon substrates. Nevertheless, it is intended that the invention disclosed herein can be advantageously employed in other semiconductor materials such as germanium or gallium arsenide and it is equally applicable to other semiconductor technologies. Accordingly, application of the present invention should not be limited to devices fabricated in silicon substrates, but instead should encompass those devices fabricated in any of a number of substrates.

Moreover, while the present invention is disclosed in a number of preferred embodiments directed to silicon substrates, it is intended that these disclosures be considered as illustrative examples of the preferred embodiment of the present invention and not as limitations on the scope of the applicability of the present invention. Moreover, while the illustrated examples concern the improved insulated gate semiconductor device in connection with an insulated gate transistor, it is recognized that the present invention is also applicable to other insulated gate semiconductor devices such as insulated gate thyristors in which it is desirable to avoid latching. Further, while the present invention provides for an increased latching threshold, it is also recognized that the attendant benefits of improved turn-off time can also be achieved.

Figure 2:
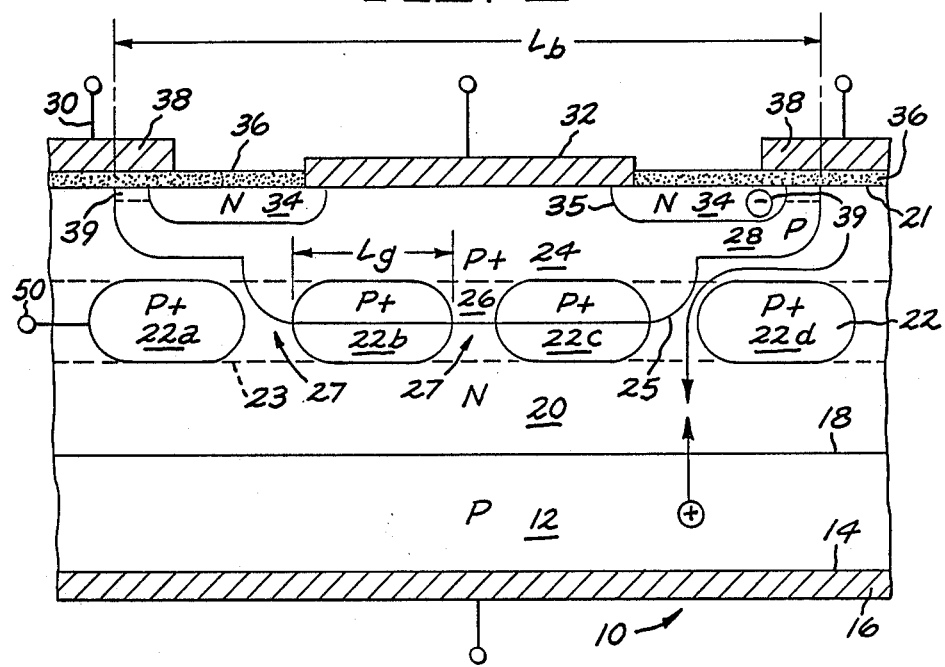
FIG. 2 is a cross-sectional illustration of the first embodiment of an insulated gate transistor constructed in accordance with the present invention.
Figure 3:
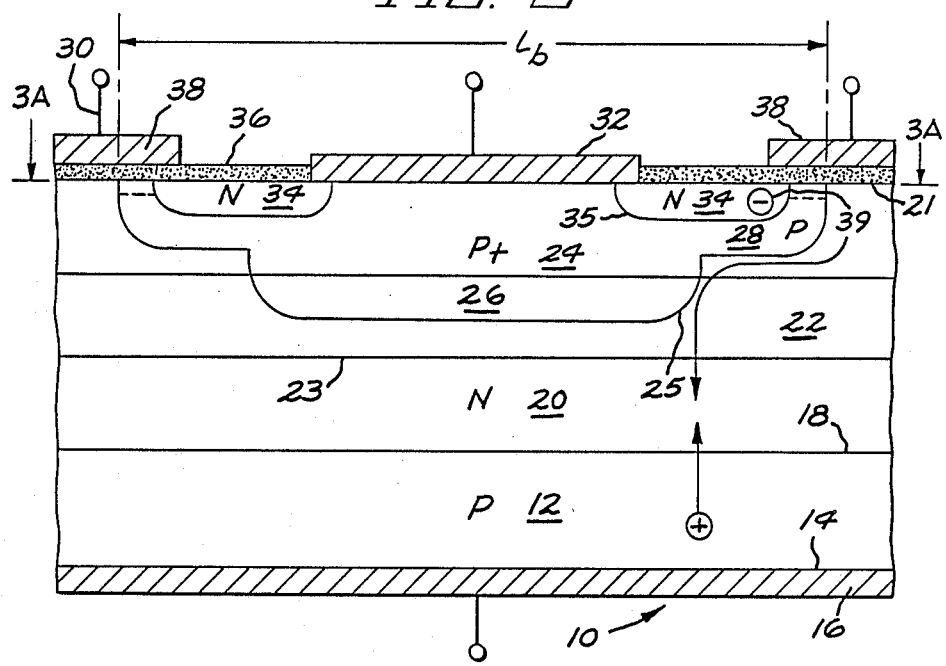
FIG. 3 is a cross-sectional illustration of an alternate embodiment of a MOS controlled thyristor constructed in accordance with the present invention.

Given the corresponding relationship of FIGS. 2 and 3, corresponding parts of these figures have been designated with the same reference numerals as an aid to understanding the description of the present invention.

Various parts of the semiconductor elements, however, have not been drawn to scale. Certain dimensions have been exaggerated in relation to other dimensions in order to present a clearer understanding of the invention. Although for the purpose of illustration the preferred embodiment of the insulated gate semiconductor device of the present invention has been shown in each particular embodiment to include specific P and N type regions, it is understood by those skilled in the art that the teachings herein are equally applicable to insulated gate semiconductor devices in which the conductivities of the various regions have been reversed to, for instance, provide for the dual of the illustrated device. Further, although the embodiments illustrated herein are shown in two dimensional views, the various regions of the device have width, length and depth. It is therefore to be understood that the illustrations show only a portion of a single cell of a device which is comprised of a plurality of cells arranged in a three dimensional structure.

Referring now to FIG. 2, a preferred embodiment of the insulated gate semiconductor device in accordance with the present invention is shown in vertical cross section. The device 10 is illustrated to comprise a partially processed semiconductor wafer 12 shown as a first layer of one type conductivity material. In the illustrated embodiment, one type conductivity material has been shown as P type material. The first layer 12 has a first surface 14. A first electrode 16 is disposed on the first surface 14 in ohmic contact with the first layer 12. Although not shown in the illustrated embodiment, the first layer 12 can also comprise a heavily doped surface region such as a P+surface region adjacent the first surface 14 to facilitate the establishment of ohmic contact between the first electrode 16 and the first layer 12.

The first layer 12 also has a second surface 18 on which a second layer 20 illustrated as a moderately doped N type conductivity drift layer is disposed. The second layer also has a surface 21. In alternate preferred embodiments, either the first layer 12 or the second layer 20 can comprise the substrate with the other layer being established thereon by, for instance, epitaxial growth or doping techniques such as implantation or diffusion doping.

A P+grid 22 shown as comprising a plurality of discrete P+regions 22a, 22b, 22c and 22d, is established by, for instance, making spaced implantations of a heavy concentration of P or one type conductivity determining impurities to a prespecified depth beneath the surface 21 of the second layer. Each grid region 22a–22d is preferably implanted to a depth which is approximately equal to one and one-half times the maximum depth of the subsequently implanted first region or base region 24 (discussed below) to thus provide a grid 22 and hence a conductive path for one type conductivity carriers below and beneath the first or base region 24 of the device. Although the grid 22 is illustrated to comprise only regions 22a, 22b, 22c and 22d, the grid can comprise any number of regions arranged in a substantially planar relationship beneath the first region 24 and equidistantly spaced beneath the first surface 21. It is preferred that the grid regions 22 be periodically interconnected by P or one type conductivity regions 23 shown in phantom in FIG. 2 to provide a P or one type conductivity path between the regions and to ensure the grid is a substantially equipotential plane.

A first region 24 of P or one type conductivity is also disposed within the second layer of the device 10 and forms a PN junction 25 therewith. The first region 24 of the device 10 preferably comprises a heavily doped central portion 26 extending to a depth which is greater than the depth of a more lightly doped perimeter portion 28 which partially surrounds the central region 26. Thus, the perimeter portion 28 of the first region 24 forms a shallow shelf region while the central portion 26 forms a deep central portion of the first region 24. It is preferred that the deep portion of the first region 24 overlap and directly contact one or more of the regions 22a, 22b, 22c and 22d of the grid 22 to directly establish a one type conductivity conductive path betwee the grid 22 and the first region 24 and hence the cathode electrode 32. Further, it is preferred that at least one portion such as regions 22a or 22d of the grid 22 be separated from the first region 24 by a portion of the second layer 20 to define an opening 27 between adjacent grid regions 22a, 22b, 22d and 22d and also between the grid 22 and the first region 22 to foster the flow of opposite type carriers therebetween. One type conductivity carriers flow into the grid 22, into the first region 24 and to the cathode electrode 32.

A second region 34 of opposite type conductivity is disposed within the first region 24 and forms a PN junction 35 therewith. The second region 34 is preferably formed within the shelf portion 28 of the first region 24 and in combination with the second layer 20 defines channel portion 39 of the first region 24. A portion of the second region 34 is disposed within the shallow shelf portion 28 of the first region and an additional portion of region 34 extends laterally above the deep portion 26 of the first region 24. A portion of the second region 34 also overlies a portion of the grid 22 and more particularly, overlies region 22b of the grid 22 which is separated by the second layer 26 from the first region 24 and the main portion of the grid 22a.

A first surface 21 of the device 10 comprises a portion of the first surface 21 of the second layer 20, a portion of the surface of the second region 34 and a portion of the surface of the first region 24. An insulation layer 36 such as silicon dioxide is disposed over the first surface 21 of the device and overlies a portion of the second region 34, the first region 24 and the second layer 20. A gate material 38 such as doped polysilicon is disposed atop insulation layer 36 and overlies the second region 34, portion 28 of the first region 28 and a portion of the second layer 20. The second region 34 in combination with the second layer 20, defines the channel portion 39 of the first region 24 which is subject to insulated gate control. In the illustrated embodiment, the insulated gate electrode 38, in response to an appropriate applied bias, establishes an opposite type conductivity channel within the channel portion 39 of the first region 24 to facilitate the flow of opposite type conductivity carriers from the second region 34 through the channel portion 39 of the first region 24 and into the second layer 20. In response to removal of that bias, opposite type conductivity carriers cease to flow through the channel 39.

A cathode electrode 32 is preferably disposed on the first surface of the device 10 in ohmic contact with the first and second regions 24 and 34, respectively. It is preferred that the cathode electrode 32 short the PN junction 35 between the first and second regions 24 and 34, respectively where this junction 35 meets the surface 25 to inhibit the junction 35 from becoming forward biased.

The grid 22 is preferably disposed entirely beneath the shelf portion 28 of the first region 24 and also entirely beneath the channel 39. Each region of the grid preferably has a lateral width $L_g$ equal to approximately 25% or less of the lateral width $L_b$ of the base region 24 of the device 10. Such construction ensures that an interstitial opening 27 will be disposed proximate the channel orifice into the second layer 20 proximate the intersection of the channel 39 with the second layer. Each grid region 22 preferably comprises an oblong cylinder, a cross-section of which is shown in FIG. 2. In this cross-section, the radius of $r_1$ is greater than $r_2$. The longitudinal or primary axis of the region extends perpendicular to the plane of the illustrate. In a device in which the first and second regions 24 and 34, respectively, are substantially annular in configuration, the orientation of the primary axis of the grid does not matter. However, in an alternate embodiment shown in FIG. 3A, the primary axis of the grid 22 is disposed transverse and substantially perpendicular to the longitudinal axis of the first and second regions 24 and 34, respectively. Alternately, as shown in FIG. 22, the longitudinal axis of the grid 22 can be substantially parallel to the longitudinal axis of the first and second regions 24 and 34, respectively.

Figure 1:
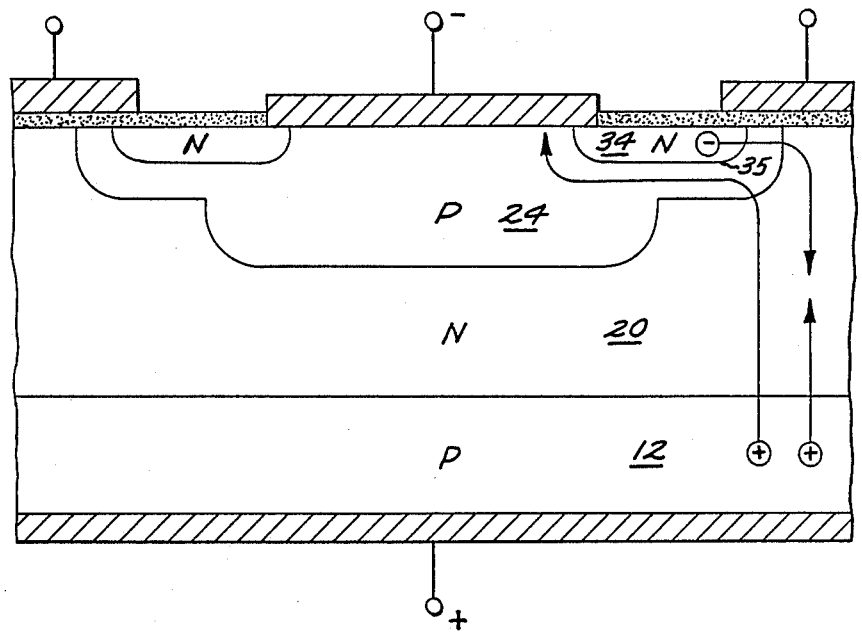
FIG. 1 is a cross-sectional illustration of a conventional insulated gate transistor.

As shown in FIG. 1, in a conventional device, opposite type conductivity carriers flow through the channel and recombine with P type conductivity carriers provided by the first layer. P type conductivity carriers also flow from the first layer 12 through the second layer 20 and into the first region 24. Inasmuch as the second region 34 presents an obstruction to the direct flow of these carriers to the cathode electrode 32, these carriers flow closely adjacent the PN junction 35 the first and second regions 24 and 34, respectively. Depending upon the conductivity of the second region and the magnitude of the current flow within this region, Ohm's law predicts the magnitude of the voltage drop which occurs along this junction 35. If this voltage drop exceeds approximately 0.7 volts, the forward bias threshold for silicon devices, the PN junction 35 becomes forward biased and P type conductivity carriers flow from the first region 24 into the second region 34 to forward bias the base emitter junction of an NPN transistor comprising the second layer 20, the first region 24 and the second region 34. In response to the forward biasing of the NPN transistor, a second PNP transistor comprising the first layer 12, the second layer 20 and the first region 24 is also forward biased. A regenerative current flow between the first and second transistors is established. The regenerative current flow between the first and second transistor latches the device into a conductive mode without regard to the removal of the previously applied gate bias and hence a conductive path between the anode and cathode electrodes exits without regard to gate bias. The device can be turned off by removing or commutating the potential applied between the anode and cathode electrodes.

In accordance with the present invention, the grid 22 has been provided to establish a means for collecting one type carriers from the first layer 12 and providing a special current path for one type carriers. The one type conductivity carrier current path is spaced and separated from the PN junction 35 to avoid establishing a voltage drop adjacent the junction 35. While the illustrated embodiment shows a portion of grid 22 overlapping with the first region 24 and thus being directly connected through the first region 24 and to the cathode electrode 32, as previously explained, the grid 22 can also be coupled to a separate external collector electrode shown schematically by terminal 50 which may advantageously be connected to the cathode potential. Thus, P type conductivity carriers need not flow in a vertical direction through the first region 24 to the cathode electrode 32, but can be separately channeled via, for instance, a separate collector electrode 50 illustrated schematically in FIG. 2. One type conductivity carriers can be guided to the cathode electrode 32 away from the area of the first region 24 proximate the PN junction 35 not only by the illustrated configuration of the grid 22, but also by other configurations of the grid 22. In addition, when the external electrode 50 is electrically connected to the grid 22, a special potential can be applied to the external electrode 50 to make the alternate grid current paths more electrically attractive. It is thus within the scope of the present invention to provide a separate collector electrode 50 in contact with the grid 22 even when the grid 22 overlaps and directly connects to the first region 24. In a preferred embodiment, the collector electrode 50 attached to the grid 22 can also be connected to the cathode electrode 32 of the device 10 or to the same potential as the cathode electrode to thus provide an alternate current path for the flow of P type conductivity carriers to the cathode potential of the device.

The present invention can be employed in devices in which the size, configuration and doping concentration of the various regions can vary broadly over a wide range of values. It is thus difficult to specify any particular device parameters which would be said to encompass all preferred embodiment of the present invention. Nevertheless, by way of making a full disclosure of the present invention to the art, the below listed device regions can be fabricated with the specified parameters to provide a satisfactorily working device.

| Device Region | Doping Concentration (dopant atoms/cc) |
|---|---|
| First layer 12 | $10^{18}$–$10^{21}$ |
| Second layer 20 | $10^{13}$–$10^{16}$ |
| Grid 22 | $10^{18}$–$10^{21}$ |
| First region 24 | $10^{16}$–$10^{20}$ |
| Second region 28 | $10^{16}$–$10^{18}$ |

Referring now to FIG. 3A, an alternate preferred embodiment of the present invention is shown wherein the longitudinal axis of the grid 22 is disposed transverse and in a preferred embodiment, substantially perpendicular to the longitudinal axis of the first region 24. In this embodiment, the grid provides a low resistance current path which is transverse to the first region of the device 10 and thus facilitates the flow of hole current in this direction.

FIG. 3A is a top plan view of a portion of the structure of a cell as would be seen taken along lines 3A—3A of FIG. 3. More particularly, the longitudinal axis of the grid regions 22 extend transverse to the longitudinal axis of the first region 24 to facilitate the flow of carriers in a transverse direction. In a preferred embodiment, the longitudinal axis of grid 22 is disposed perpendicular to the longitudinal axis of the first region 24. While not shown in FIG. 3A, the grid 22 can be interconnected by cross connectors extending between adjacent grids.

Figure 4:
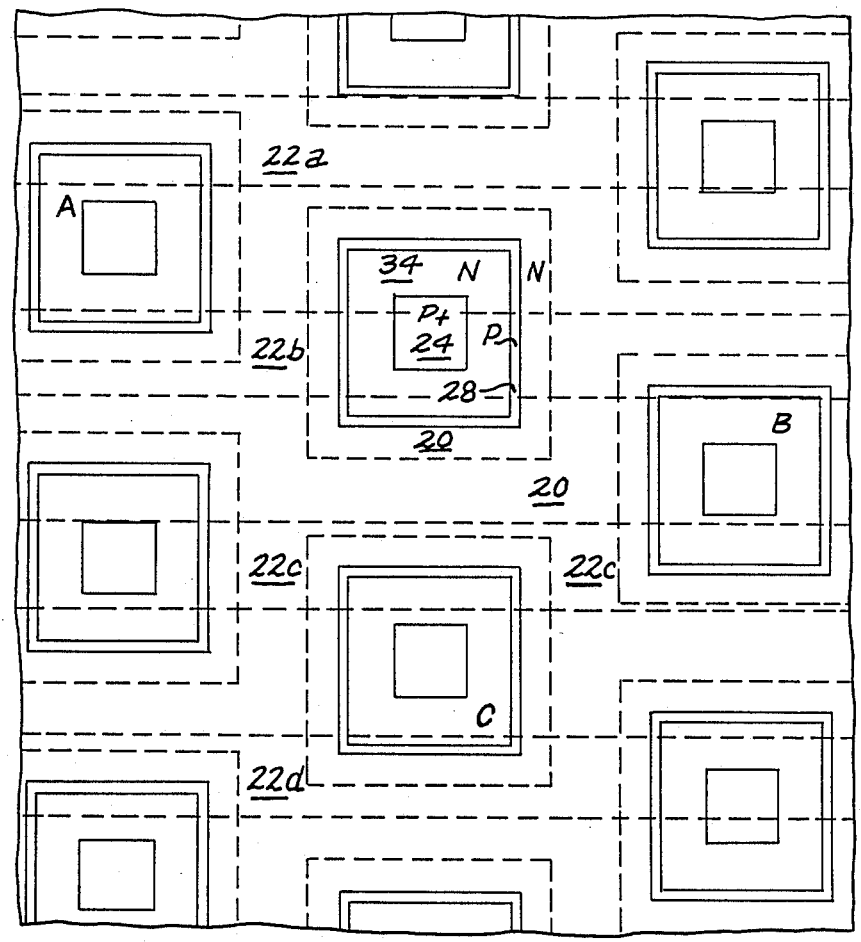
FIG. 4 is an illustration of a top plan view of a cell layout wherein adjacent grids are interconnected by the devices themselves.

FIG. 4 is an illustration of an alternate preferred embodiment of the present invention wherein a plurality of cells are shown to be arranged in a geometric pattern with respect to the grids 22. In this embodiment, the first region 24 interconnects the adjacent grid regions 22. More particularly, as illustrated, cell A interconnects grids 22a and 22b while cell B interconnects grids 22b and 22c and cell c interconnects grids 22c and 22d.

Figure 5:
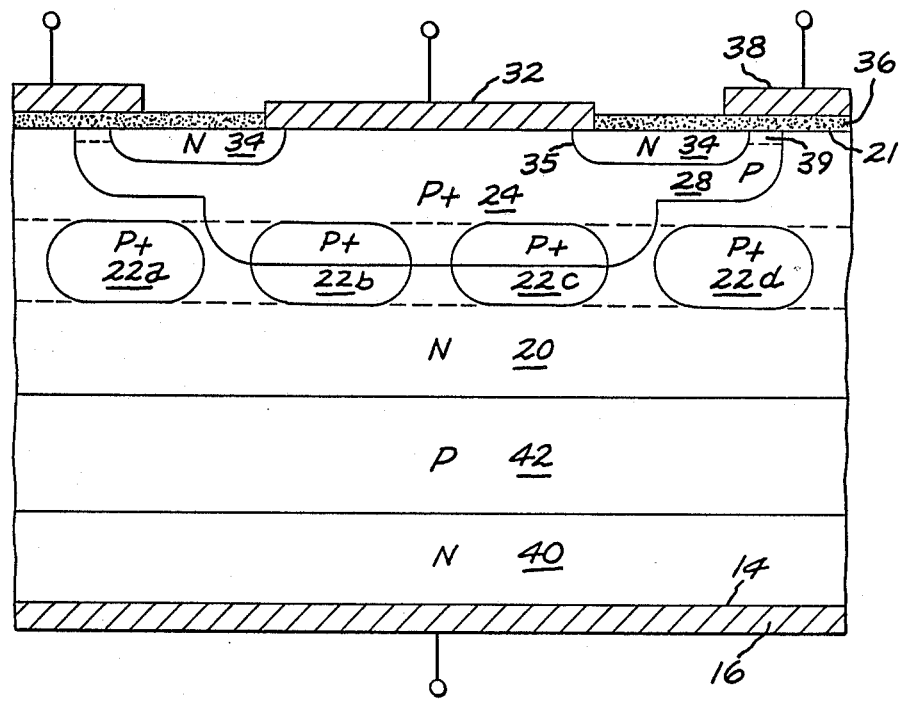
FIG. 5 is a cross-sectional illustration of a cell on an alternate device constructed in accordance with an alternate preferred embodiment of the present invention.

As illustrated in FIG. 5, the present invention can also be applied to provide other types of insulated gate semiconductor devices. More particularly, when the partially processed wafer 12 can comprise a first zone 40 of opposite type conductivity semiconductor material adjacent the first surface 14 of the and a second zone 42 of one type conductivity atop the the first zone with the first and second region being disposed in the second layer 20 to thus provide a MOS controlled thyristor. It is preferred that the grid 22 be entirely submerged beneath the second surface 21 of the device 10.

Figure 6A:
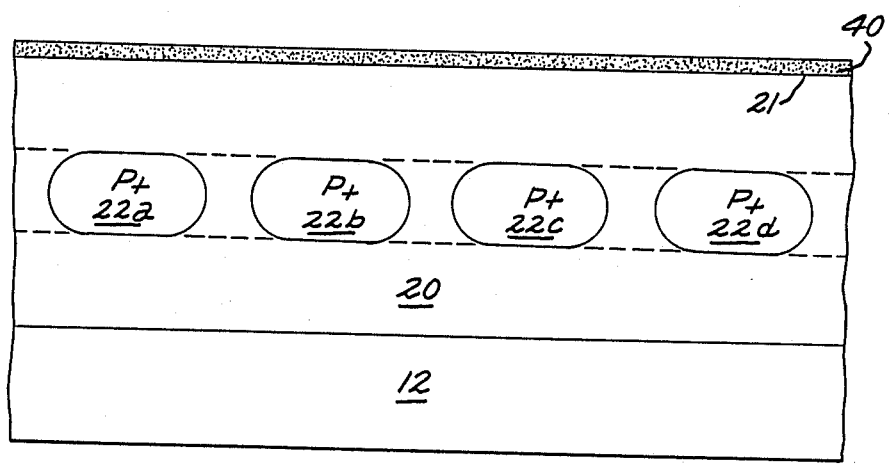
Figures 1, 6A:
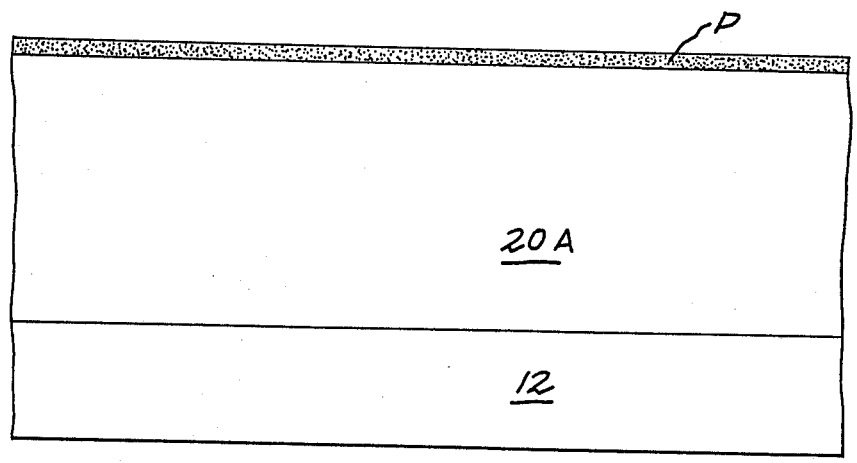
Figures 2, 6A:
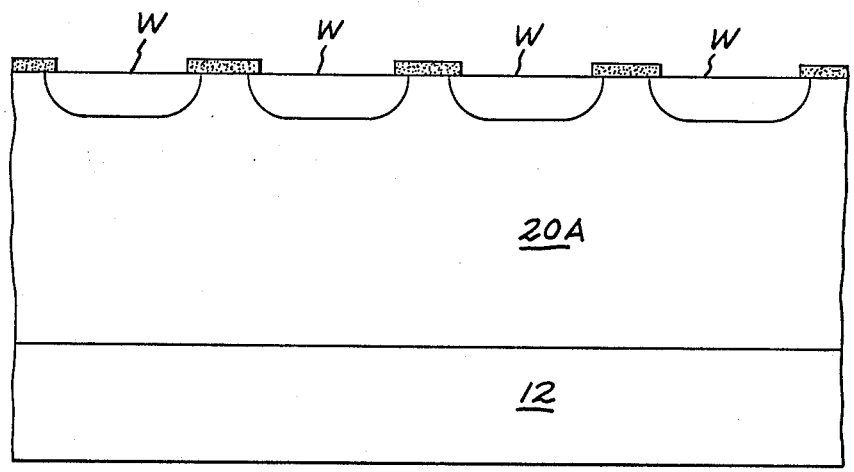
Figures 3, 6A:
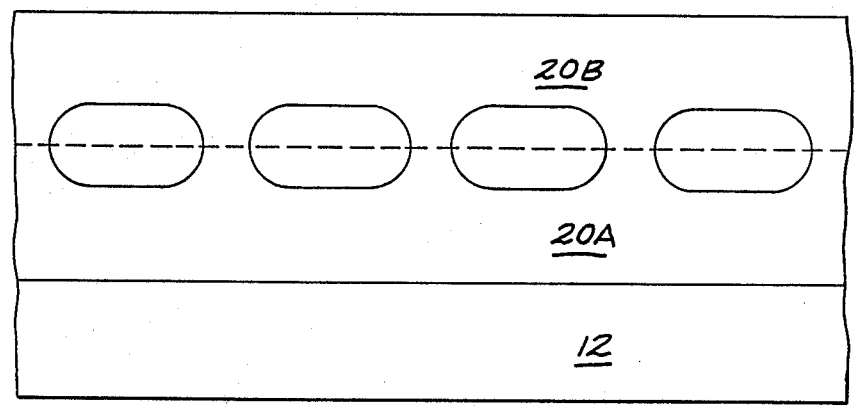

Referring now to FIGS. 6A–4H, a method in accordance with the present invention is shown in successive stages of performance. More particularly, as shown in FIG. 6A, the partially processed semiconductor wafer 12 used in fabricating the semiconductor device of the present invention is shown to comprise a first layer 14 such as a layer of one type conductivity semiconductor material which is illustrated as P-type silicon material. A second layer 20 of opposite type conductivity semiconductor material is disposed atop the first layer 12. In alternate preferred embodiments, either the first layer 14 of the second layer 20 can be the substrate layer and the other layer can be disposed atop thereof by, for instance, epitaxial growth or doping techniques such as implantation or diffusion techniques. The second layer 20 has a first surface 21.

A first protective layer 40 such as silicon dioxide is provided atop the first surface 21 of the device 10. It is preferred that the partially processed wafer comprising the first and second layers 12 and 20, respectively is initially processed to establish the short grid regin 22 therein. More particularly, it is preferred that a series of implantations be performed with one type impurities, such as boron dopants, to provide a series of heavily doped one type conductivity regions disposed entirely beneath the surface 21 of the second layer 20 to establish a grid region 22 laterally disposed with the active region of the second layer 20. The implantations can be performed with impurities charged to greater than or equal to 300 KV for multiply charged ioned particles.

An alternate method of establishing a body of semiconductor material containing a grid is shown in FIGS. 6A-1 and 6A-3. Initially, a body of semiconductor material is provided having a first layer 12 of one type conductivity and first portion 20A of the second layer 20 of opposite type conductivity disposed thereon. The first portion 20A of the second layer 20 is grown to within 2 to 5 microns of its final thickness. A first protective layer P is provided on the exposed surface of the second layer 20A. A plurality of windows W are opened through the first protective layer P as shown in FIG. 6A-2. Thereafter, the exposed surface is exposed to an impurity environment containing opposite type impurities and a plurality of opposite type conductivity regions are established within the second layer 20. Thereafter, as shown in FIG. 6A-3, a second portion 20B of the second layer can be established by epitaxial growth to thus cause the grid to lie entirely beneath the surface of the device. It should be noted that the grid region 22 can also be established by implantation followed by epitaxial growth of the second portion 20B of the second layer 20.

As shown in FIG. 6B, thereafter, a first window 42 is opened through the first protective layer to expose a first portion 44 of the surface of the second layer 20 of the semiconductor device 10. The exposed surface portion 44 of the second layer 20 is doped with a heavy concentration of one type conductivity dopants such as boron dopants by, for instance, implantation of diffusion techniques to establish a first portion 26 of the first region 24 comprising a heavy concentration of one type conductivity carriers.

Thereafter, and as shown in FIG. 6C, a second mask is used to open a second window 48 through the first protective layer 40 to expose a second surface portion 50 of the surface of the second layer 20. The second surface portion 50 circumscribes and encompasses the first portion 44 of the second layer 20. Thereafter, a moderate concentration of one type conductivity impurities such as boron impurities is introduced by, for instance, implantation or diffusion techniques into the second layer 20 and the first portion 26 of the first region 24 to establish a second portion 28 of the first region 24. The second portion 24 extends to a depth which is less than the depth of the first portion 26 of the first region 24 and partially latterally surrounds the first portion 26 of the first region 24. The second portion 26 is also less heavily doped that the first region 28.

Thereafter, and as shown in FIG. 6D, a second protective layer 54 such as a silicon oxide layer 54 is formed within the second window 48.

Thereafter and as shown in FIG. 6E, a third annular or ring-shaped window 64 is opened through the second protective layer 54 to expose a third surface portion 66 of the surface 21 of the device 10. Thereafter, opposite type conductivity dopants such as arsenic dopants are introduced through the third window 64 into the first region 24 to establish a second region 34 of opposite type conductivity.

Figure 6F:
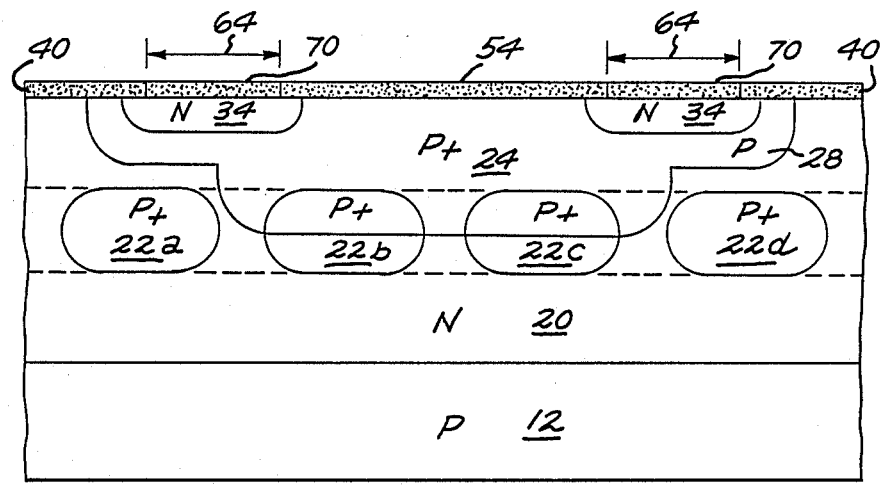
Figure 6G:
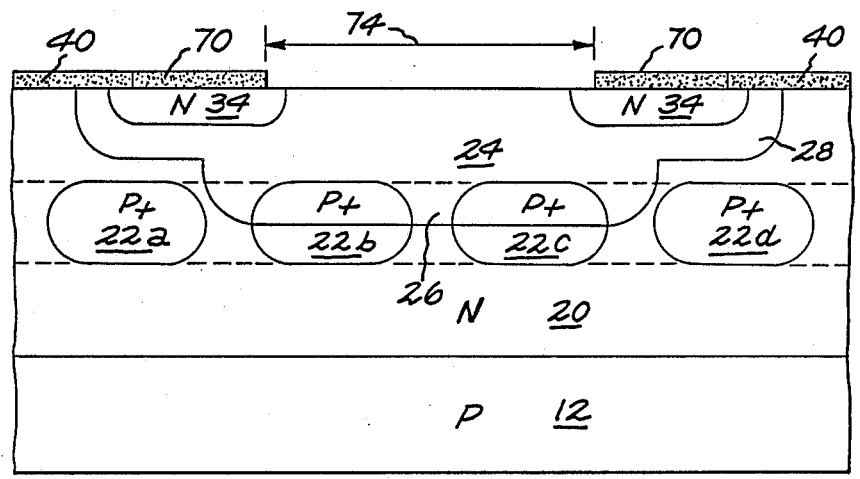

As shown in FIG. 6F, a third protective layer 70 such as a silicon dioxide layer is formed within the third window 64. Thereafter, and as shown in FIG. 4G, a fourth window 74 is opened through the second protective layer 54 and a portion of the third protective layer 70.

Figure 6H:
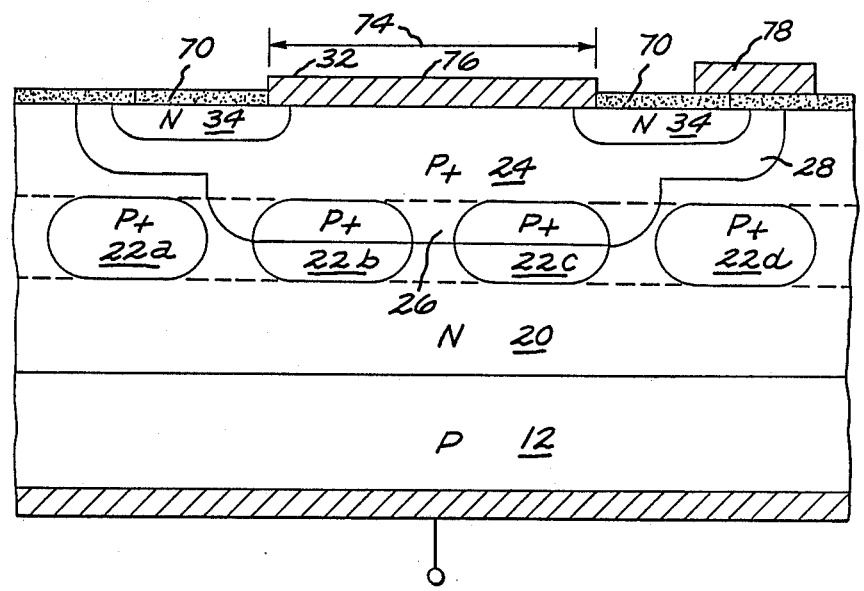

As shown in FIG. 6H, a metallization layer 76 such as aluminum is deposited within the fourth window 74 on the first surface to establish a cathode electrode 32 in ohmic contact with the first and second regions 24 and 34, respectively. In addition, the metal layer 76 is applied over the insulation layer 70 to provide a gate electrode material 78 such as a metal. The gate material can be selected from the group comprising polysilicon, polysilicide and refractory metals. Tungsten is preferably deposited over the first insulation layer 40 and possibly a portion of the third insulation layer 70. The gate electrode material 78 thus overlies a second portion 28 of the first region 24 as well as a portion of the second region 34 and the second layer 20.

It is preferred that the first region 24 be doped and driven in relation to the grid 22 so that in one embodiment, the first region 24 overlaps onto a portion of the grid 22 and in alternate embodiment, so that a region 22b of the grid 22 remains discrete and separated by the second layer 20 from the first region 24 to establish a separate grid region 22b of one type conductivity within the device.

In a preferred embodiment, a separate electrode 30 is provided to the heavily doped grid 22 by, for instance, providing a sinker region 80 of one type conductivity making contact with the grid 22, and providing a metallized contact within an extremity of the device to establish direct electrical connection to the heavily doped grid of the device. Electrical contact can also be established between the grid electrode 30 and the cathode electrode 22 to provide two cathode current paths for one type conductivity carriers.

It is to be recognized that while the preferred embodiments of the present invention have been disclosed with respect to an insulated gate transistor, the extra short grid of the present invention is equally applicable to other insulated gate semiconductor devices. Further, it is to be recognized that the inclusion of the extra short grid of the present invention within the insulated gate semiconductor device improves not only the latching threshold of the device, but also provides for improvements in other operating characteristics such as turn-off capability.

While preferred embodiment of the present invention have been illustrated and described, it is clear that the invention is not so limited. Numerous modifications and changes, variations and substitutions and equivalents will occur to those skilled in the art without departing from the true spirit and scope of the present invention. Accordingly, it is intended that the invention herein be limited only be scope of the appended claims.

What is claimed is:

1. An insulated gate semiconductor device comprising:
   a body of semiconductor material including:
      a first layer of one type conductivity,
      a second layer of opposite type conductivity disposed atop said first layer,
      a first region of one type conductivity within said second layer,
      a second region of opposite type conductivity disposed within said first region,
   said body having a first surface to which said second layer, said first region and said second region extend, and
      a heavily doped grid of one type conductivity disposed within said second layer and spaced from said first surface for establishing a current path for one type conductivity carriers, said grid comprising a plurality of segments of one type conductivity disposed in a substantially planar arrangement and a plurality of aperture therebetween each occupied at least in part by a portion of said opposite type conductivity second layer, at least one of said grid segments and at least one of said grid apertures in projection on said first surface extending into a projection of said first region on said first surface;
   a first power electrode disposed in ohmic contact with said first layer;
   a second power electrode disposed in ohmic contact with said first and second regions; and
   an insulated gate electrode disposed on said first surface over a portion of said first region for, in response to an appropriate bias potential, establishing a channel through said first region between said second layer and said second region for facilitating the flow of opposite type conductivity carriers between said second layer and said second region;

said heavily doped grid being ohmically connected to said second power electrode.

2. The semiconductor device of claim 1 wherein said substantially planar arrangement overlaps a portion of said first region.

3. The semiconductor device of claim 1 wherein a portion of said grid is spaced from said first region by said second layer.

4. The semiconductor device of claim 1 wherein a portion of said grid is coupled to said first region.

5. The semiconductor device of claim further comprising a grid electrode disposed in ohmic contact with said grid region and connected to said second power electrode.

6. The semiconductor device of claim 1 wherein said first region comprises a shallow shelf portion of one type conductivity and a heavily doped deeper central portion of one type conductivity.

7. The semiconductor device of claim 1 wherein said grid includes a heavily doped portion which is separated from the first region by said second layer.

8. The semicoductor device of claim 7 wherein said heavily doped portion is disposed beneath said second region.

9. The semiconductor device of claim 1 wherein said first layer comprises a heavily doped zone.

10. The semiconductor device of claim 1 further including a third electrode in ohmic contact with said first layer.

11. The semiconductor device of claim 1 wherein said first region has a width $L_b$ in a first direction substantially parallel to said first surface and each of said grid segments, has a width $L_g$ less than or equal to 0.25 $L_b$ in said first direction.

12. The semiconductor device of claim 1 wherein said grid has a total volume equal to approximately 75% of the total volume of the first region.

13. The semiconductor device of claim 2 wherein said first region provides said ohmic connection between said first power electrode and said grid.

14. The semiconductor device recited in claim 1 wherein said device has only three external terminals, a first terminal connected to said first power electrode, a second terminal connected to said second power electrode and the third terminal connected to said gate electrode.

15. An insulated gate semiconductor device comprising:
a body of semiconductor material including:
a first layer of one type conductivity,
a second layer of opposite type conductivity disposed atop said first layer,
a third layer of said one type conductivity disposed atop said second layer,
a first region of opposite conductivity within said third layer,
a second region of one type conductivity disposed within said first region,
said body having a first surface to which said third layer, said first region and said second region extend, and
a heavily doped grid of opposite type conductivity disposed within said third layer and spaced from said first surface for establishing a current path for opposite type conductivity carriers, said grid comprising a plurality of segment of opposite type conductivity disposed in a substantially planar arrangement and a plurality of apertures therebetween each occupied at least in part by a portion of said one type conductivity third layer, at least one of said grid segments and at least one of said grid apertures in projection on said first surface extending into a projection of said first region on said first surface;
a first power electrode disposed in ohmic contact with said first layer;
a second power electrode disposed in ohmic contact with said first and second regions; and
an insulated gate electrode disposed on said first surface over a portion of said first region for, in response to an appropriate bias potential, establishing a channel through said first region between said third layer and said second region for facilitating the flow of opposite type conductivity carriers between said third layer and said second region;
said heavily doped grid being ohmically connected to said second power electrode.

16. The semiconductor device recited in claim 15 wherein said device has only three external terminals, a first terminal connected to said first power electrode, a second terminal connected to said second power electrode and third terminal connected to said gate electrode.

* * * * *